(12) United States Patent
Voogel et al.

(10) Patent No.: US 6,509,739 B1
(45) Date of Patent: Jan. 21, 2003

(54) METHOD FOR LOCATING DEFECTS AND MEASURING RESISTANCE IN A TEST STRUCTURE

(75) Inventors: Martin L. Voogel, Los Altos; Leon Ly Nguyen, San Jose; Narasimhan Vasudevan, Sunnyvale, all of CA (US)

(73) Assignee: Xilinx, Inc., San Jose, CA (US)

( * ) Notice: Subject to any disclaimer, the term of this patent is extended or adjusted under 35 U.S.C. 154(b) by 1 day.

(21) Appl. No.: 09/709,184

(22) Filed: Nov. 8, 2000

(51) Int. Cl.⁷ .............................................. G01R 31/28
(52) U.S. Cl. ...................................................... 324/525
(58) Field of Search ................................ 324/525, 537, 324/550, 607, 704, 705, 711, 713, 715, 718, 719; 340/511, 514, 522; 323/235, 353; 219/483, 497, 501; 361/86, 88

(56) References Cited

U.S. PATENT DOCUMENTS

| | | |
|---|---|---|
| 5,057,772 A | * 10/1991 | Bruno et al. ............. 324/158 P |
| 5,083,083 A | 1/1992 | El-Ayat et al |
| 5,506,509 A | 4/1996 | Susak |
| 5,561,367 A | 10/1996 | Goettling et al |
| 5,857,258 A | * 1/1999 | Penzes et al. ................. 29/846 |

FOREIGN PATENT DOCUMENTS

EP           0288804 A2     11/1988

* cited by examiner

*Primary Examiner*—N. Le
*Assistant Examiner*—Etienne LeRoux
(74) *Attorney, Agent, or Firm*—Jeanette S. Harms; Bever Hoffman & Harms

(57) ABSTRACT

A test structure provides defect information rapidly and accurately. The test structure includes a plurality of lines provided in a parallel orientation, a decoder coupled to the plurality of lines for selecting one of the plurality of lines, and a sense amplifier coupled to the selected line. To analyze an open, a line in the test structure is coupled to the sense amplifier. A high input signal is provided to the line. To determine the resistance of the open, a plurality of reference voltages are then provided to the sense amplifier. A mathematical model of the resistance of the line based on the reference voltage provided to the sense amplifier is generated. Using this mathematical model, the test structure can quickly detect and characterize defect levels down to a few parts-per-million at minimal expense.

20 Claims, 14 Drawing Sheets

METHOD FOR LOCATING DEFECTS AND MEASURING RESISTANCE IN A TEST STRUCTURE

BACKGROUND OF THE INVENTION

1. Field of the Invention

The invention relates to debugging of advanced wafer-processing technologies, and specifically to quantifying the magnitude of and localizing defects on wafers.

2. Description of the Related Art

During the fabrication process, a wafer receives a number of doping, layering, and patterning steps. Each of these steps must meet exacting physical requirements. However, all steps have some variation from perfect calibration, thereby resulting in some variation on the wafer surface.

To minimize these variations, numerous inspections and tests are performed to detect undesirable defects. Once detected, these defects are analyzed in a process called failure analysis. During failure analysis, valuable information regarding problems with fabrication materials, process recipes, ambient air, personnel, process machines, and process materials can be discovered. Therefore, detection of defects on an integrated circuit is critical to high yields and process control.

When a new manufacturing process is being developed, a test structure may advantageously be manufactured specifically for testing the new manufacturing process. Alternatively, a wafer primarily including desired integrated circuit devices may also include test structures interspersed between the desired devices.

FIG. 1 illustrates two standard test structures 100: a fork 101 and a serpentine 102. To identify defects using one of these structures, a user would provide an input signal on one end of the structure and determine if an appropriate output signal was generated at the other end. These test structures can be placed on test chips or on actual production chips to test manufacturing processes.

Test structures 100 allow for the testing of "opens" and "shorts". An open is a failure in the connectivity or an excessively high resistance between two allegedly connected points. Serpentine 102 is typically used to detect opens. A short is a failure when connectivity exists between allegedly unconnected points. An open can be in a metal wire (line), a polysilicon line, a diffusion line, a contact, or a via. A short can be metal-to-metal, polysilicon-to-polysilicon, diffusion-to-diffusion, or contact-to-polysilicon. Fork 101 is typically used to detect shorts.

The above-referenced test structures, i.e. fork 101 and serpentine 102, have distinct drawbacks. For example, locating and analyzing failures using either structure is difficult and time consuming. Specifically, detecting an open or short condition tells the user nothing about exactly where on the fork or serpentine the defect is located.

Determining the location of the defect requires an inspection of the structure by the user. In the current art, visual inspection is a major method of determining chip failure. A visual inspection is a tedious process, which requires considerable time of an experienced product engineer. Moreover, to complicate matters, not all visual defects result in electrical failures. Therefore, to more closely analyze the visual defects, the user must typically perform both optical and scanning electron microscope (SEM) examinations. Furthermore, many defects are not visible by initial inspection, thereby making localization of the defects with a SEM extremely difficult if not impossible.

Of importance, even when defects are localized, current technology provides no means to quantify the magnitude of the defect. Both the location and the magnitude of the defect provide valuable information to the user for failure analysis and may even indicate the nature of the defect without performing failure analysis. Because of its expense and complexity, users try to minimize the use of failure analysis. As known by those skilled in the art, an extremely large defect is probably the result of particle contamination rather than incomplete etching. However, the identification of other types of defects is less clear. Therefore, even after localization, many types of defects must still be subjected to failure analysis.

Therefore, a need arises for a cost-effective method and test structure to quantify the magnitude of and localize defects on a wafer.

SUMMARY OF THE INVENTION

In accordance with the present invention, a test structure used for testing a manufacturing process provides defect information rapidly and accurately. The test structure is designed to mimic structures that will be present in a commercial device. The test structure includes a first plurality of lines provided in a first parallel orientation, a first decoder coupled to the first plurality of lines for selecting one of the first plurality of lines, and a first sense amplifier coupled to the output of the first decoder. To analyze an open, a line in the test structure is coupled to a sense amplifier. A high input signal is provided to the line. To determine the resistance of the open, a plurality of reference voltages are then provided to the sense amplifier.

In the present invention, a mathematical model of the resistance of the line based on the reference voltage provided to the sense amplifier is generated. In one embodiment, the mathematical model is generated using a simulation program such as HSPICE. Using this mathematical model, the test structure of the present invention can quickly detect defect levels down to a few defects-per-million locations tested at minimal expense.

The test structure can also determine the location of the defect(s) on the line. To achieve this, the test structure further includes a plurality of transistors, each transistor having a source, a drain, and a gate, the source and drain connected respectively to the selected line and an adjacent, non-selected line, and the gate coupled to selection circuitry. Using the selection circuitry, the transistors are selectively turned on/off, thereby creating predetermined paths through the test structure. The resistances associated with various paths are then compared to determine the location of the open(s). In this manner, the location of the open(s) can be determined within a few micrometers.

If the opens are substantially distributed across the tested line, then failure analysis can still be tedious, time-consuming, and sometimes non-conclusive. However, if one segment of the tested line has a significantly higher resistance than other segments, then failure analysis can be done quickly and yield much more certain conclusions. Thus, the present invention facilitates better failure analysis.

In accordance with the present invention, the test structure further includes a second plurality of lines provided in a second parallel orientation, a second decoder coupled to the second plurality of lines for selecting one of the second plurality of lines, and a second sense amplifier coupled to the output of the second decoder. In one embodiment, the second parallel orientation is perpendicular to the first parallel orientation. The first plurality of lines is formed from one layer and the second plurality of lines is formed from another layer in the integrated circuit. In this manner, separate feedback can be provided for each process layer.

To determine a short, a plurality of test strips are formed parallel to each of the first plurality of lines in the test structure. Each test strip is coupled to one of the second plurality of lines. By providing a high signal to the tested line in the first plurality of lines and monitoring the output signal of the appropriate one of the second plurality of lines, the present invention rapidly and accurately identifies a short between the tested line and the corresponding test strip.

DETAILED DESCRIPTION OF THE DRAWINGS

Figure 1:
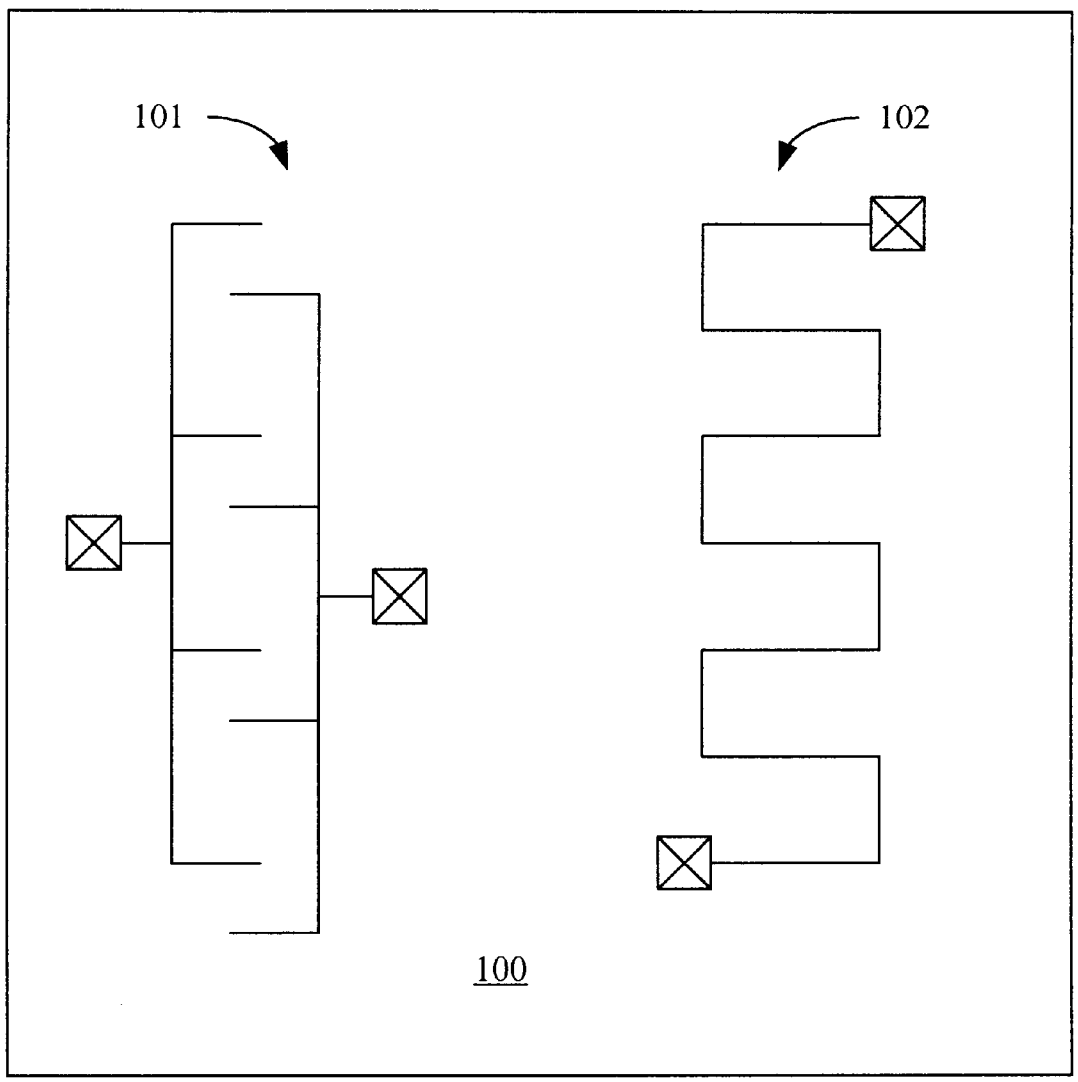
FIG. 1 illustrates standard yield structures placed on integrated circuits used for testing a manufacturing process.

An integrated circuit is formed from multiple layers including semiconductor layers, conductive layers, and insulation layers. In accordance with the present invention, test lines are formed from the semiconductor and conductive layers to facilitate identifying defects, i.e. opens and shorts, in the integrated circuit. Therefore, the term "layer" herein will refer to one of the semiconductor or conductive layers.

An actual test structure in accordance with the present invention would typically include lines formed in each metal (conductive) layer as well as in a layer comprising semiconductor materials. Therefore, an actual test structure would include multiple layers, all stacked based on relative locations in the integrated circuit. For example, assuming the integrated circuit has five metal layers, layer one could include n- and p-type diffusion areas, polysilicon, and associated contacts (n-diffusion, p-diffusion, and polysilicon). Layer two could include metal 1 and vias formed with metal 1. Layer three could include metal 2 and vias formed with metal 2. Layer four could include metal 3 and vias formed with metal 3. Layer five could include metal 4 and vias formed with metal 4. Finally, layer six could include metal 5 and vias formed with metal 5. In the present invention, each layer includes either horizontal or vertical lines formed from the material present in that layer. Adjacent layers have different line orientations.

Figure 2A:
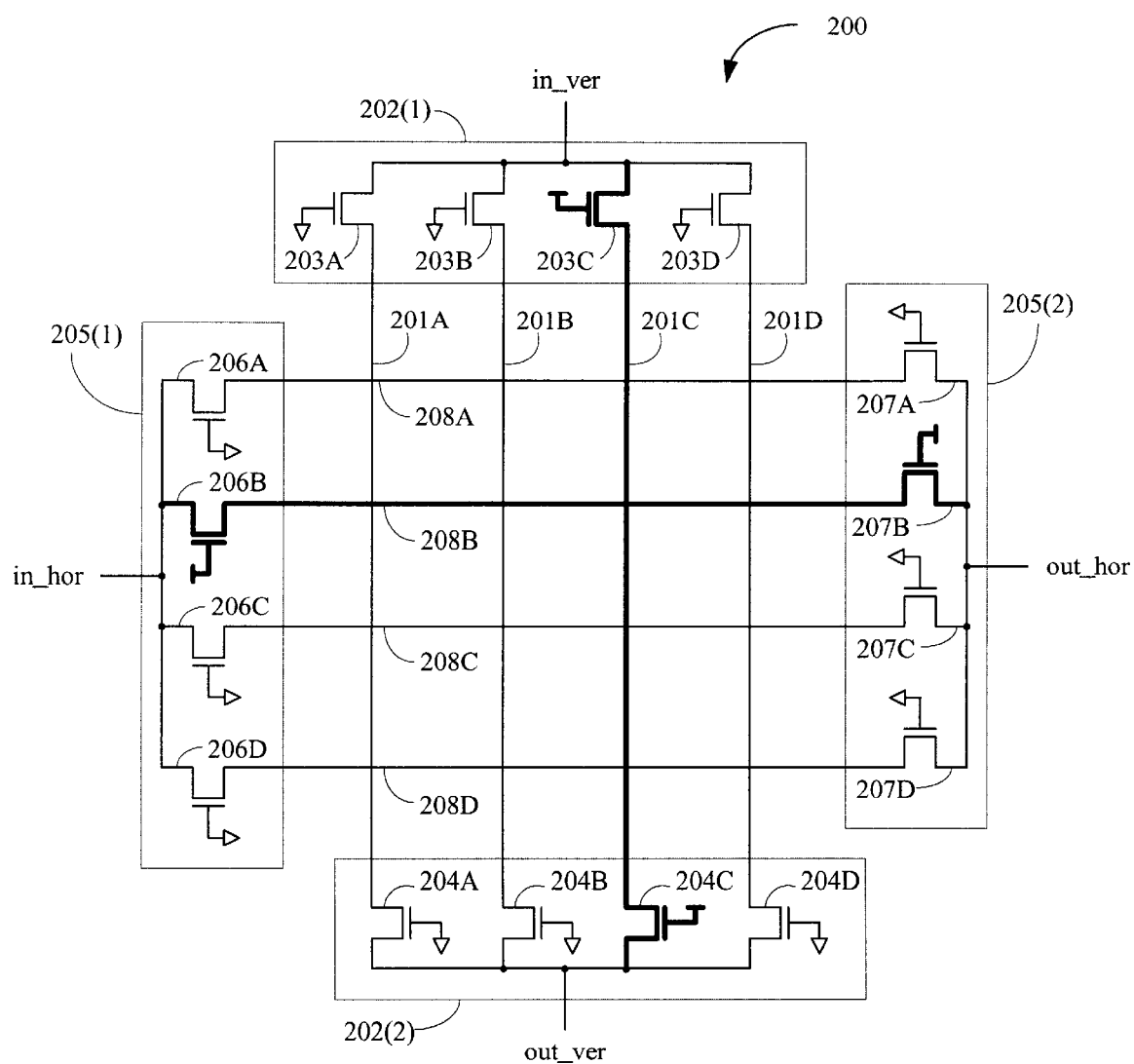
FIG. 2A illustrates a simplified test structure for locating opens in an integrated circuit to which the inventive test structure may be added.

FIG. 2A is a simplified schematic of a test structure 200 located on a chip for determining the presence of opens. Test structure 200 includes a plurality of horizontal lines 208A–208D formed from one layer in the integrated circuit and a plurality of vertical lines 201A–201D formed from an adjacent layer in the integrated circuit. Thus, an actual test structure would include multiple test structures 200 stacked according to relative layers in the integrated circuit.

Note that although only four lines are shown in each orientation, i.e. horizontal or vertical, any number of lines (typically hundreds or even thousands of lines) can be provided to accurately replicate layout conditions on the integrated circuit. Therefore, the four horizontal and vertical lines are shown for illustration purposes only and are not meant to limit the present invention.

To detect for any open in the lines of test structure 200, each horizontal and vertical line must be tested. Circuit 200 can be used to isolate each such line for testing. Specifically, a vertical decoder 202, having an input decoder section 202(1) and an output decoder section 202(2), is used to turn on the appropriate decoder transistors to isolate a vertical line 201. (Note that the circuitry for turning on and off specific decoder transistors is well known in the art and therefore, is not described in detail herein.) In a similar manner, a horizontal decoder 205, having an input decoder section 205(1) and an output decoder section 205(2), is used to turn on the appropriate decoder transistors to isolate a horizontal test line 208.

For example, to test for an open in a vertical line 201C, decoder transistors 203C and 204C (part of input decoder section 202(1) and output decoder section 202(2), respectively) are turned on by providing an appropriate high voltage to their gates. Decoder transistors 203A, 203B, and 203D as well as decoder transistors 204A, 204B, and 204D are turned off by providing an appropriate low voltage to their gates. In this manner, vertical line 201C is isolated from other vertical lines in test structure 200.

A high input test signal in_ver is then provided to circuit 200. If an output test signal out_ver is also high, then vertical line 201C has no opens (i.e. highly resistive elements) and is characterized as "passing". On the other hand, if the output test signal out_ver is low, then vertical line 201C has an open and is characterized as "failing".

A similar procedure can be performed to test for opens in a horizontal line 208. For example, to test for an open in a horizontal line 208B, decoder transistors 206B and 207B (part of input decoder section 205(1) and output decoder section 205(2)) are turned on by providing an appropriate high voltage to their gates. Decoder transistors 206A, 206C, and 206D as well as transistors 207A, 207C, and 207D are turned off by providing an appropriate low voltage to their gates. In this manner, horizontal line 208B is isolated from other horizontal lines in test structure 200. Then, a high input test signal in_hor is provided to test structure 200. If an output test-signal out_hor is also high, then horizontal line 208B has no opens.(i.e. highly resistive elements) and is characterized as "passing". On the other hand, if the output test signal out_hor is low, then horizontal line 208B has an open and is characterized as 37 failing".

Note that one pair of decoder transistors is provided for each line. Thus, an actual test structure would include hundreds or even thousands of pairs of decoder transistors, each pair corresponding to one line in the test structure.

Using test structure 200 instead of yield structures 100 significantly reduces the time to locate opens. For example, in seconds, test structure 200 can locate an open, which might take a user performing a visual inspection of a yield structure hours to locate. Moreover, test structure 200 detects an open without the requisite skill of an experienced product engineer or the expense of a SEM, thereby significantly reducing the cost of human and equipment resources.

In accordance with the present invention, to detect an open, a sense amplifier compares an output signal (i.e., a signal out_ver or out_hor transferred through a tested line) with a reference voltage vref. Voltage vref controls the sensitivity of the sense amplifier. If the input signal is greater than voltage vref, then no open is present and the. sense amplifier outputs a logic one signal (characterized as passing). In contrast, if the input signal is less than voltage vref, then at least one open must be present and the sense amplifier outputs a logic zero signal (characterized as failing).

If a number of opens are identified on the integrated circuit and the user wants to perform failure analysis on those opens, then knowing the magnitude of the resistances associated with the opens would be extremely helpful. Specifically, applicant has determined that the magnitude of the resistances in large part depends on the process problem involved. Therefore, knowing the magnitude of the resistances may provide valuable clues to identify and correct the process problem. This is particularly true of "immature" processes in which process controls are not fully developed. Thus, even for a well-known process, such as the CMOS process, a technology shrink using this process will require its own process controls.

Figure 2B:
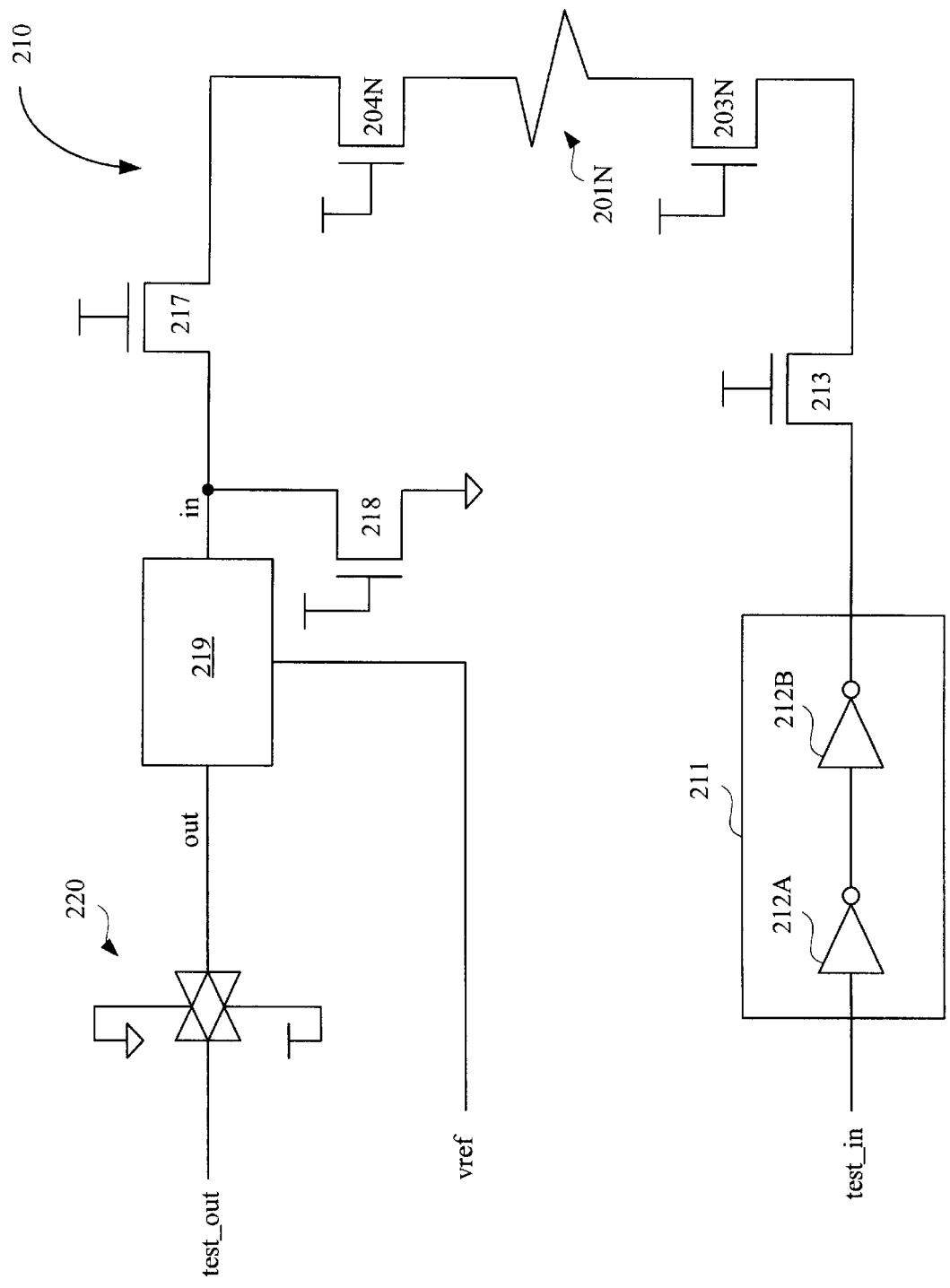
FIG. 2B illustrates exemplary detection circuitry that can be used in the present invention.

FIG. 2B illustrates an exemplary detection circuit 210 that can be used in the present invention. Two vertical decoder transistors 203N and 204N have had their gates coupled to voltage Vdd and therefore are turned on. In this manner, a vertical line 201N is selected for testing. Detection circuit 210 includes a sense amplifier 219 that receives an input signal "in" that has been buffered and passed through vertical line 201N, represented by a resistor, and generates an output signal "out" based on the reference voltage vref.

Figure 2C:
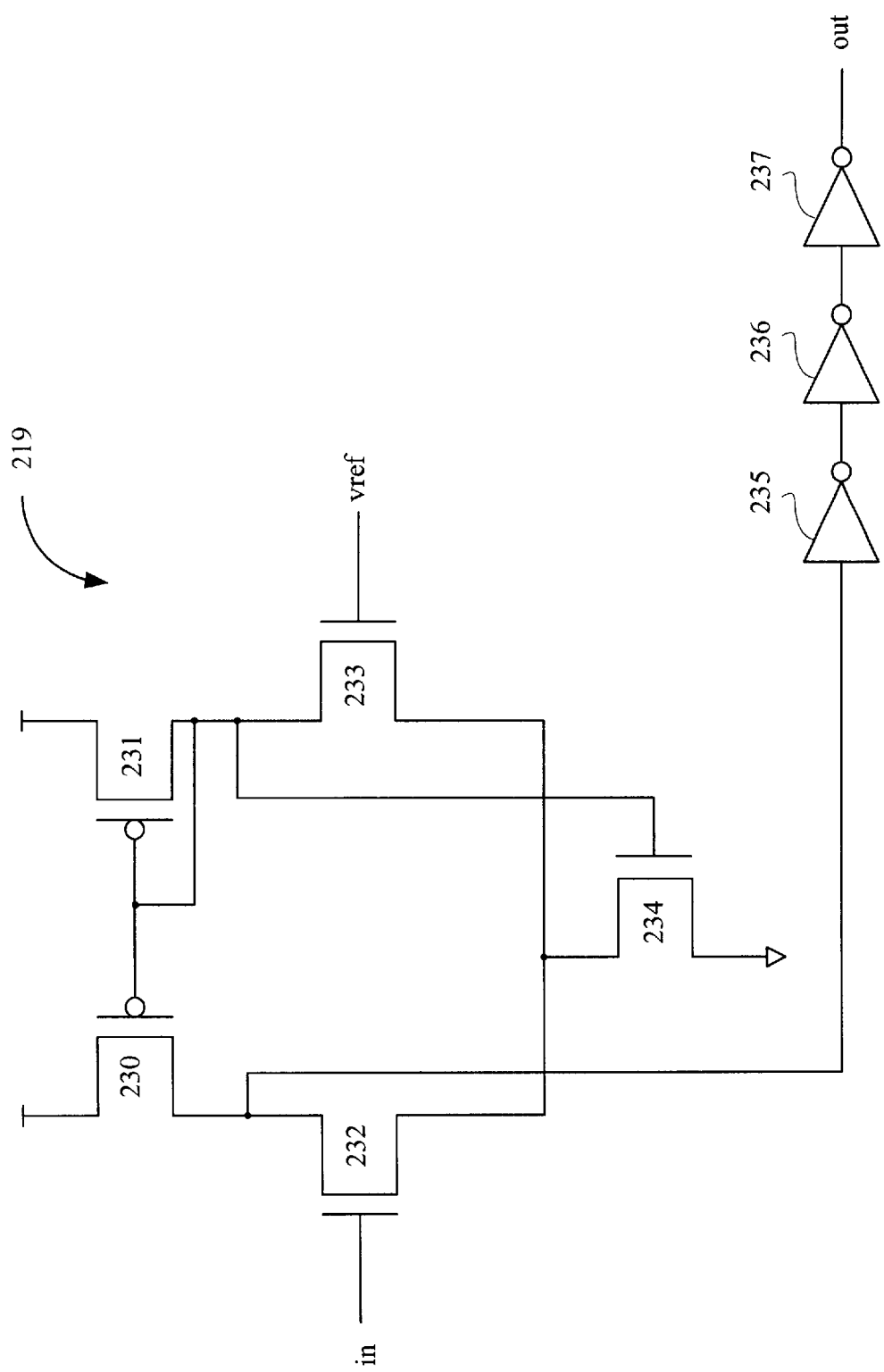
FIG. 2C illustrates one sense amplifier that can be used in the detection circuitry of FIG. 2B.

An illustrative sense amplifier 219 is shown in FIG. 2C. In the embodiment of FIG. 2C, sense amplifier 219 includes two PMOS transistors 230 and 231 having their gates coupled, their sources coupled to a common voltage source Vdd, and their drains respectively coupled to the drains of two NMOS transistors 232 and 233. These NMOS transistors have their gates coupled respectively to the input signal "in" and the reference voltage vref and their sources coupled to the drain of an NMOS transistor 234. Transistor 234 further has a gate coupled to the drain of PMOS transistor 231. The drain of PMOS transistor 230 is coupled to the output signal "out" via three inverters 235, 236, and 237 coupled in series. In this configuration, sense amplifier 219 functions as a current mirror.

Table 1 below summarizes the sizes of the transistors comprising the elements of the embodiment of sense amplifier 219 shown in FIG. 2C.

TABLE 1

| ELEMENT | WIDTH (microns) | LENGTH (microns) |
|---|---|---|
| 230 | 7.5 | 0.36 |
| 231 | 7.5 | 0.36 |
| 232 | 23.0 | 0.36 |
| 233 | 23.0 | 0.36 |
| 234 | 5.0 | 0.36 |
| 235 (PMOS) | 7.5 | 0.36 |
| 235 (NMOS) | 2.5 | 0.36 |
| 236 (PMOS) | 5.0 | 0.36 |
| 236 (NMOS) | 2.5 | 0.36 |
| 237 (PMOS) | 20.0 | 0.36 |
| 237 (NMOS) | 10.0 | 0.36 |

Note that although a specific embodiment of a sense amplifier is provided in FIG. 2C, sense amplifier 219 can be any known sense amplifier, and is not limited to the current mirror sense amplifier described in detail herein. For example, in another embodiment, the present invention includes a cross-coupled sense amplifier.

In yet another embodiment, sense amplifier 219 is replaced with an inverter (thereby eliminating the need for reference voltages). As known by those skilled in the art, an inverter, like a sense amplifier, has a trigger point. Although the magnitude of the defect cannot be determined (as explained in reference to FIG. 3 below) using a single inverter, the location of the defect can be found using one of the test structures of the present invention. To determine the magnitude of the defect, multiple inverters having different trigger points could be provided with the test structures. In this embodiment, inverters are selectively coupled to the tested line. In this manner, the relative magnitude of the defect can be determined. And in yet another embodiment, instead of measuring voltage, the current is measured to determine the resistance.

Referring back to FIG. 2B, a driver 211 includes two inverters 212A and 212B coupled in series for driving a test_in signal to vertical line 201N. Driver 211 provides the above-mentioned buffering function. Transistor 213 represents the means to provide the path from driver 211 to vertical decoder transistor 203N. Therefore, transistor 213 could include one or more transistors (or even other devices). Transistor 217 represents the means to provide the path from vertical decoder transistor 204N to sense amplifier 219. Therefore, like transistor 213, transistor 217 could include one or more transistors (or even other devices). Transistor 218, having its gate coupled to Vdd, provides a weak pull-down to the input of sense amplifier 219. Therefore, sense amplifier 219 receives a logic zero, unless a high test_in signal is provided. Transmission gate 220 ensures that the out signal of sense amplifier 219 is transferred to the appropriate circuitry (not shown) as the test_out signal.

Table 2 below summarizes the widths and lengths of various transistors comprising the elements of detection circuit 210.

TABLE 2

| ELEMENT | WIDTH (microns) | LENGTH (microns) |
|---|---|---|
| Inverter 212A (PMOS) | 10 | 0.35 |
| Inverter 212A (NMOS) | 5 | 0.35 |
| Inverter 212B (PMOS) | 20 | 0.35 |
| Inverter 212B (NMOS) | 10 | 0.35 |

TABLE 2-continued

| ELEMENT | WIDTH (microns) | LENGTH (microns) |
|---|---|---|
| Access transistor 213 | 50 | 0.35 |
| Decoder transistor 203N | 10 | 0.35 |
| Decoder transistor 204N | 10 | 0.35 |
| Access transistor 217 | 50 | 0.35 |
| Pull-down transistor 218 | 1 | 40 |
| Transmission gate 220 (PMOS) | 20 | 0.35 |
| Transmission gate 220 (NMOS) | 10 | 0.35 |

As mentioned previously, the reference voltage vref controls the sensitivity of sense amplifier 219. In other words, for different values of voltage vref, different line resistances would cause vertical line 201N to be characterized as an open.

If the resistance of vertical line 201N is below 10,000 Ohms, then most users would characterize vertical line 201N as not open (i.e. the line "passes"). On the other hand, if the resistance of vertical line 201N is instead 1 MOhm, then most users would characterize vertical line 201N as an open (i.e. the line "fails"). However, in current test vehicles, such as SRAM chips, the actual resistance of the tested line is not measured.

In accordance with the present invention, a simulation program is used to generate a mathematical model of the sense amplifier and the tested line. Specifically, the mathematical model plots the reference voltage vref for a specific sense amplifier versus the resistance of the tested line. In one embodiment, a simulation program HSPICE, licensed by Meta Software of Cambridge, Mass., is run on a Sun workstation to provide the mathematical model. HSPICE simulates circuits of almost any size (e.g. 250,000 gate simulations at transistor level) and runs very quickly. The results of HSPICE can be examined using a graphical analysis program, such as ViewTrace, licensed by Innoveda of Marlboro, Mass.

Other simulation programs, such as SPICE (Simulation Program with Integrated Circuit Emphasis), can also be used to generate the mathematical model. SPICE is a widely used circuit simulation program developed as public domain software at the University of California. Note that although the device models and simulation algorithms in SPICE are comparable to HSPICE, the user interface is less sophisticated in SPICE (i.e., the graphical output is intended for line printers).

Figure 3:
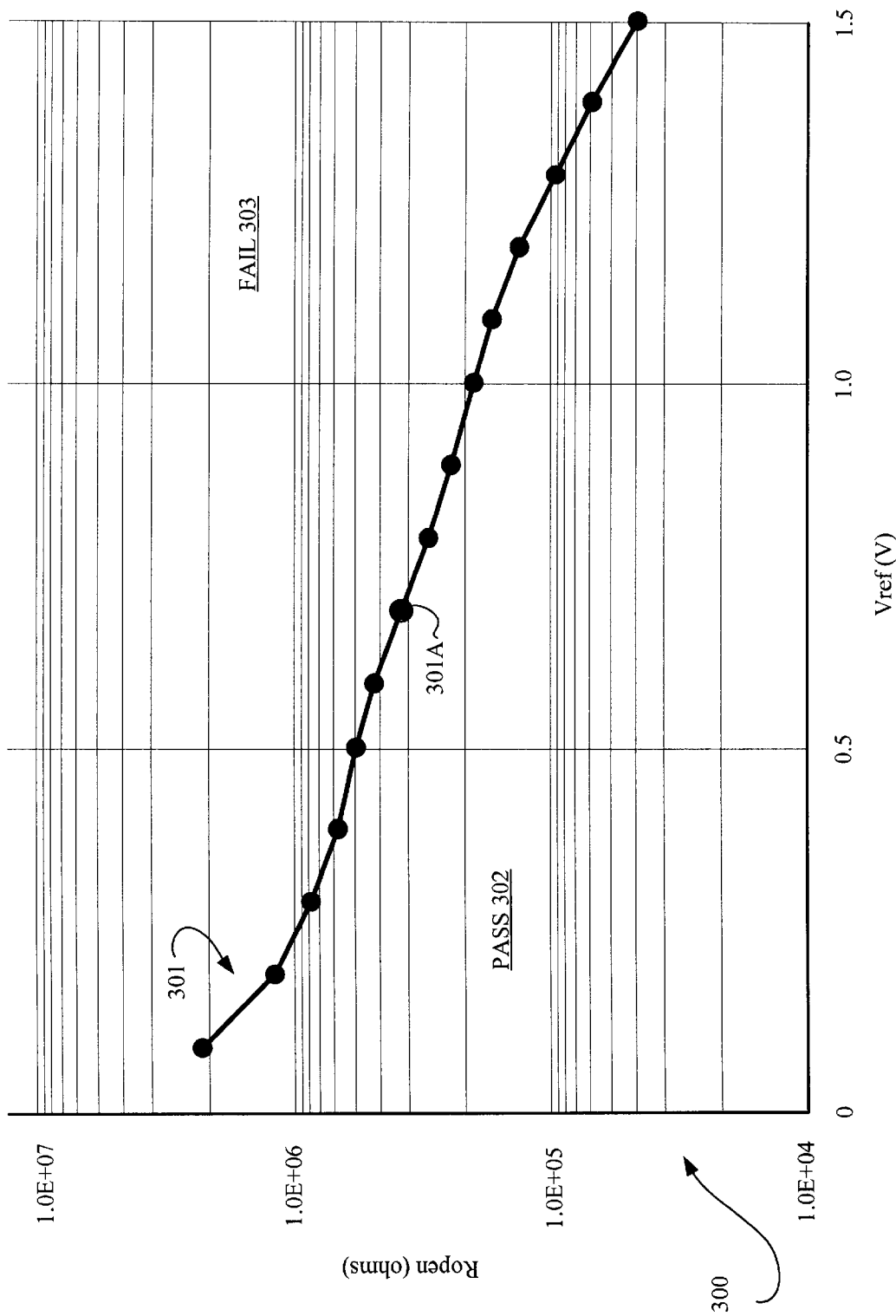
FIG. 3 illustrates a graph that provides a mathematical model of the resistance of the tested line based on the reference voltage provided to the sense amplifier.

FIG. 3 illustrates a logarithmic graph 300 generated with HSPICE to simulate sense amplifier 219 (FIG. 2C) and line 201N. Graph 300 plots reference voltage (Vref) on the x-axis and the resistance (Ropen) on the y-axis. Curve 301 indicates the resistance at which sense amplifier 219 changes its output from one logic state to another. For example, if a reference voltage of 0.7 Volts is provided to sense amplifier 219, then sense amplifier 219 changes its output signal from one logic state to another when the resistance of line 201N is equal to approximately 300 kohms (indicated by point 301A on curve 300). Thus, if the actual resistance of line 201N is less than 300 kohms, then line 201N is known to be in the "pass" (non-open) region 302; whereas, if the actual resistance of line 201N is more than 300 kohms, then line 201N is known to be in the "fail" (open) region 301.

In accordance with the present invention, the actual resistance of the tested line is measured by varying the reference voltage vref. In this manner, when the logic transition occurs, then the resistance is known. In one embodiment, successively lower reference voltages are provided to sense amplifier 219. Clearly, once a logic transition occurs, smaller changes in Vref can be provided to more accurately determine the resistance of the tested line.

In one embodiment of the present invention, a careful measurement of test structure 200 (FIG. 2A) is done using graph 300 (FIG. 3) to determine the actual resistance of a line 201. Typically, a line 201 is first tested using a high reference voltage Vref (FIG. 2B), such as 1.2V. If sense amplifier 219 outputs a logic zero signal (i.e. the input signal is less than Vref), then the resistance of the open must be greater than 150 kohm, per graph 300. In a resistance homing search, the reference voltage Vref is halved (1.2/2= 0.6) and line 201 is then tested at the new reference voltage of 0.6V. If sense amplifier 219 outputs a logic one signal (i.e. the input signal is greater than Vref), then the resistance of the open must be between 150 kohm and 400 kohm. Thus, to continue the resistance homing search, the differential between the last two reference voltages (1.2−0.6=0.6) is halved (0.6/2=0.3), this difference is added to the last reference voltage (0.6+0.3=0.9), and line 201 is then tested at this new reference voltage. The resistance homing search is continued until the value of Vref that causes sense amplifier 219 to switch state (trip voltage) is determined. This value, using graph 300, quantifies the actual resistance of line 201.

Other search methods, such as a linear search, are equally applicable to the present invention. In a linear search, a delta change in Vref, such as 0.1V is chosen, then line 201 is tested at successively lower voltages until the trip voltage is determined. Note that this method may result in a longer time to convergence unless a relatively accurate first reference voltage is chosen.

After the user knows the magnitude of the resistance in the tested line, the user can pick optimal candidates for voltage contrast testing (Vcontrast). Vcontrast is a known technique used in SEM, for example, to pinpoint the location of an open in the tested line.

During FIB, any floating metal pieces may become charged by the focused ion beam (or similarly, during SEM, any floating metal pieces may become charged by the electron beam). As a result, these pieces turn dark and are not visible on the generated x-ray. However, any metal pieces coupled to ground will not be charged (i.e. having a discharge path to ground) and thus will be bright features on the x-ray. Therefore, if an open exists in a conductor, then the portions on either side of the open will appear bright on the x-ray.

In Vcontrast, an additional cut is made anywhere on the conductor using the focused ion beam. At this point, the user merely follows the dark segment to the edge of the first bright feature. It is at this edge where the open exists. Clearly, the brighter the segment, the lower the resistance. Of course, the converse is also true, i.e. the darker the segment, the higher the resistance. Unfortunately, distinguishing conductors with no opens and conductors with opens having a low resistance (and thus having some discharge to ground) is difficult. Therefore, those skilled in the art recognize that if the resistance of the conductor is greater than 1 Mohm, then Vcontrast will work. However, if the resistance of the conductor is less than 1 Mohm, then Vcontrast will not work. Therefore, a need arises for a localization method that is effective for even relatively low resistances and preferably a method performed prior to failure analysis, thereby minimizing the expense of using SEM.

Figure 4:
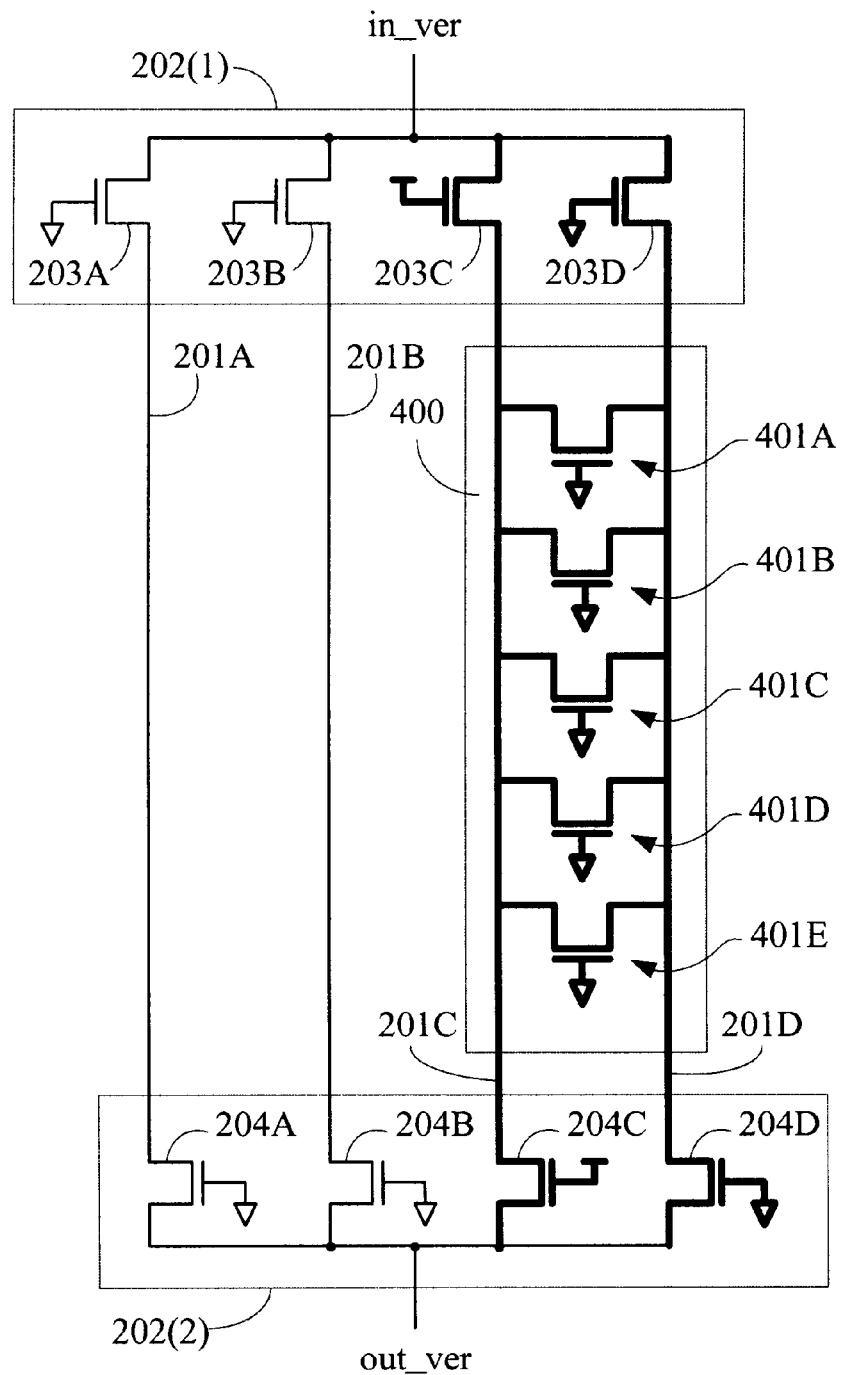
FIG. 4 illustrates a plurality of location transistors included in the structure of FIG. 2A, which facilitate identifying the location of the open (i.e., high resistance element) on the tested line.

FIG. 4 illustrates an exemplary plurality of location transistors 401A–401E providing open localization circuitry in accordance with the present invention. Note that although only five location transistors 401 are shown in FIG. 4, actual implementations typically include hundreds of location transistors 401. Each location transistor 401 has its drain coupled to the tested line (vertical line 201C, for example) and its source coupled to an adjacent line (vertical line 201D, for example). In one embodiment, location transistors 401 are controlled by decoders 202. In other embodiments, location transistors 401 are controlled by separate selection circuitry. Note that each layer typically has its own set of location transistors.

Although only vertical lines 201C and 201D are shown coupled to location transistors 401, other vertical lines as well as horizontal lines (not shown) may also be coupled to additional location transistors in a similar manner. Note that the gates of decoder transistors 203C and 204C are coupled to voltage vdd (turning on those transistors) and the gates of decoder transistors 203D and 204D remain coupled to ground (turning off those transistors), thereby ensuring that any identified open is associated with a segment on the tested line, i.e. vertical line 201C.

Figure 5:
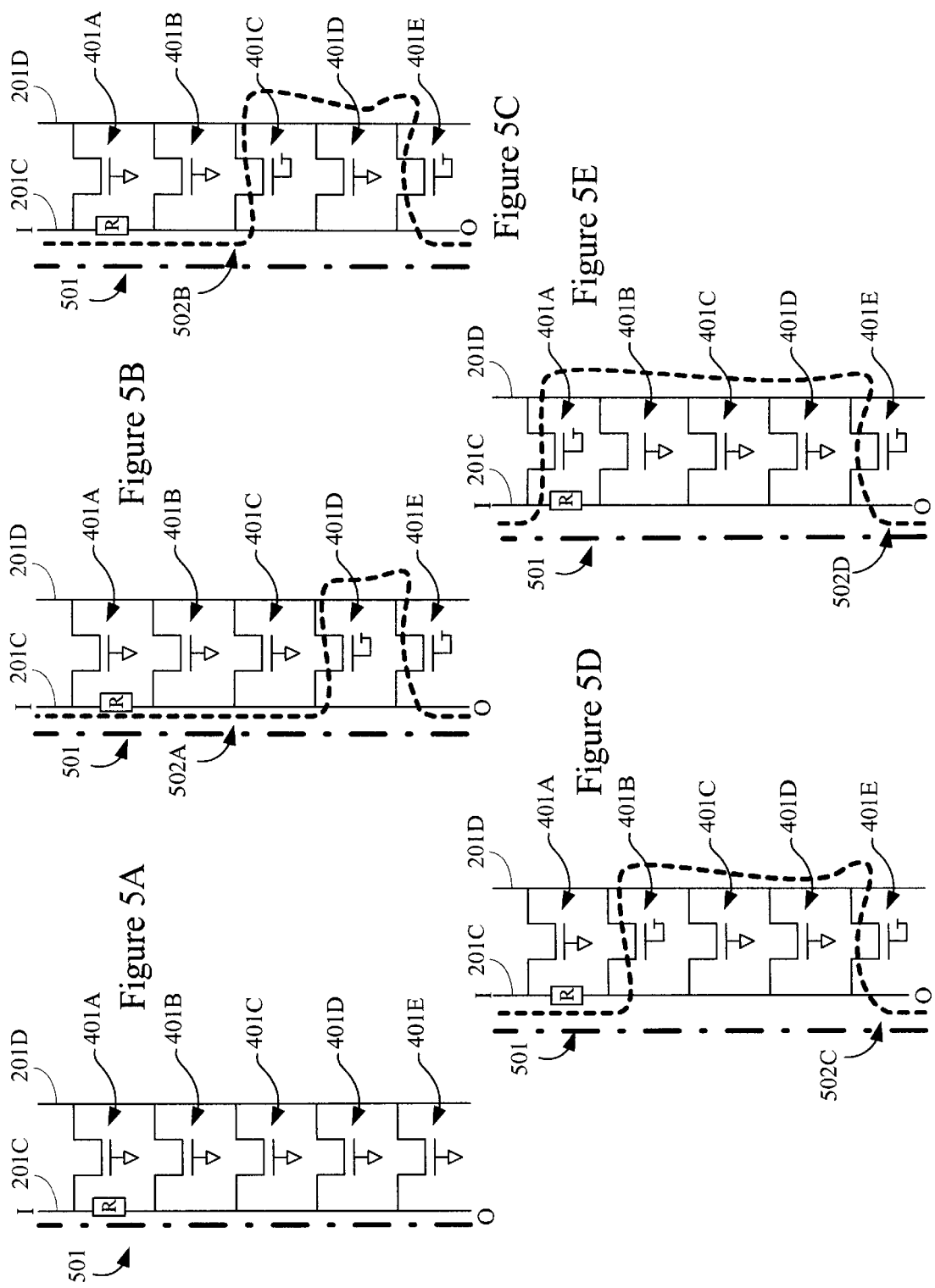
FIGS. 5A–5E illustrate the various signal paths of the test signal during one test method of the present invention.

FIGS. 5A–5E illustrate predetermined test patterns to identify the segment of the tested line that includes a highly resistive element (hereinafter resistor R). In FIG. 5A, all location transistors 401 have their gates coupled to ground, thereby turning off those transistors. Therefore, a high signal provided to a node I at the top of vertical line 201C traverses the plurality of location transistors 401 in a path 501, i.e. only along vertical line 201C. Path 501 includes resistor R and therefore the sense amplifier (not shown) coupled to a node O at the bottom of line 201C outputs a logic zero.

In FIG. 5B, location transistors 401D–401E have their gates coupled to Vcc, thereby turning on those transistors. Location transistors 401A–401C continue to have their gates coupled to ground. Vertical line 201D is floating. Therefore, a high signal provided to node I traverses the plurality of location transistors 401 in an alternate path 502A as well via original path 501. In the present invention, each segment of line 201C, defined by transistors 401, can be individually analyzed. Specifically, two transistors 401 are selectively turned on, thereby creating an alternate path 502 for the input signal. The resistances of the two paths are compared. If the resistances are different, then an open is identified. In other words, if a segment of line 201C containing the resistor R is bypassed using transistors 401, then that path 502 becomes the path of least resistance. Accordingly, the resistance of that path is less than that of original path 501. Note that the adjacent, vertical line 201D must be pre-tested to ensure that no highly resistive elements are present in this line. In this manner, any change in resistance detected by the sense amplifier is attributable to deselecting (or selecting) a certain segment of vertical line 201C having a resistor R. Resistor R is still in alternate path 502A and therefore the output signal at node O is a logic zero. Because the resistances of paths 501 and 502A are substantially equal, alternate path 502A does not localize resistor R.

In FIG. 5C, location transistors 401C and 401E have their gates coupled to Vcc, thereby turning on those transistors. Location transistors 401A, 401B, and 401D have their gates coupled to ground, thereby turning off those transistors. Vertical line 201D is floating. Therefore, a high signal provided to node I traverses the plurality of location transistors 401 in an alternate path 502B (and original path 501). Resistor R is still in the alternate path 502B and therefore the output signal at node O is a logic zero. Because the resistances of paths 501 and 502B are substantially equal, alternate path 502B does not localize resistor R.

In FIG. 5D, location transistors 401B and 401E have their gates coupled to Vcc, thereby turning on those transistors. Location transistors 401A, 401C, and 401D have their gates coupled to ground. Vertical line 201D is floating. Therefore, a high signal provided to node I traverses the plurality of location transistors 401 in an alternate path 502C (and original path 501). Resistor R is still in alternate path 502C and therefore the output signal at node O is a logic zero. Because the resistances of paths 501 and 502C are substantially equal, alternate path 502C does not localize resistor R.

In FIG. 5E, location transistors 401A and 401E have their gates coupled to Vcc, thereby turning on those transistors. Location transistors 401B–401D have their gates coupled to ground, thereby turning off those transistors. Vertical line 201D is floating. In this configuration, a high signal provided to node I traverses the plurality of location transistors 401 in an alternate path 502D (and original path 501). Resistor R is not in alternate path 502D and therefore the output signal at node O is a logic one (the input signal taking the path of least resistance through alternate path 502D). Because the resistances of paths 501 and 502D are different, alternate path 502D does localize resistor R. Specifically, the present invention identifies the segment of line 201C between transistors 401A and 401B as having resistor R.

Therefore, the present invention provides an efficient and accurate means to determine the location of the open on the tested line. In this manner, during failure analysis, the time previously spent merely locating the defect is virtually eliminated, thereby allowing a user to focus on critical processes, such as defect analysis. Note that if the exact location of the open within a segment is required, then standard Vcontrast can be used.

Moreover, in addition to determining the exact location of the open, the resistance of each segment of test line 201C can also be determined. Specifically, the resistance associated with the segment between location transistors 401D and 401E is determined by subtracting the resistance measured for path 502A in parallel with path 501 (FIG. 5B) from the resistance measured for path 501 (FIG. 5A). In a similar manner, the resistance associated with the segment between location transistors 401C and 401D is determined by subtracting the resistance measured for path 502B in parallel with path 501 (FIG. 5C) from the resistance measured for path 502A in parallel with path 501 (FIG. 5B). Note that typically, the resistance of each segment, excluding the segment including resistance R, is de minimus compared to resistance R.

Figure 6:
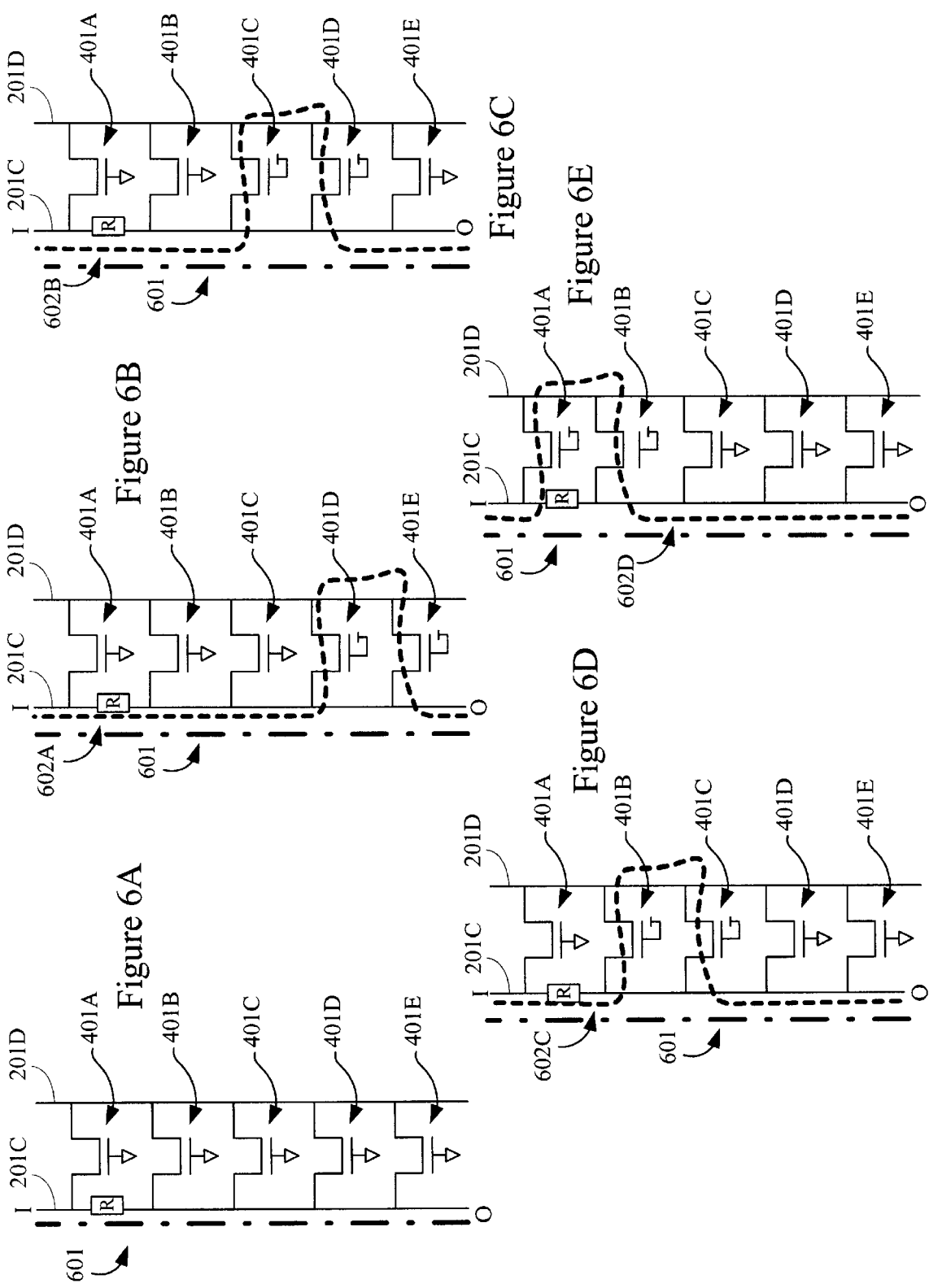
FIGS. 6A–6E illustrates the various signal paths of the test signal during another embodiment of the test method of the present invention.

FIGS. 6A–6E illustrate alternative, predetermined test patterns to identify and measure the resistance of each segment of the tested line. In FIG. 6A, all location transistors 401 have their gates coupled to ground, thereby turning off those transistors. Therefore, a high signal provided to a node I at the top of vertical line 201C traverses the plurality of location transistors 401 in a path 601, i.e. only along vertical line 201C. Path 601 includes resistor R and therefore the sense amplifier (not shown) coupled to node O at the bottom of line 201C outputs a logic zero.

In FIG. 6B, location transistors 401D–401E have their gates coupled to Vcc, thereby turning on those transistors. Location transistors 401A–401C continue to have their gates coupled to ground. Vertical line 201D is floating. Therefore, a high signal provided to node I traverses the plurality of location transistors 401 in an alternate path 602A as well as original path 601. The resistances of the two paths are compared. If the resistances are different, then an open is identified. In other words, if a segment of line 201C containing the resistor R is bypassed using transistors 401, then that path 602 becomes the path of least resistance. Accordingly, the resistance of that path is less than that of original path 601. Note that the adjacent, vertical line 201D must be pre-tested to ensure that no highly resistive elements are present in this line. In this manner, any change in resistance detected by the sense amplifier is attributable to deselecting (or selecting) a certain segment of vertical line 201C having a resistor R. Resistor R is still in alternate path 602A and therefore the output signal at node O is a logic zero. Because the resistances of paths 601 and 602A are substantially equal, alternate path 602C does not localize resistor R.

In FIG. 6C, location transistors 401C–401D have their gates coupled to Vcc, thereby turning on those transistors. Location transistors 401A, 401B, and 401E have their gates coupled to ground. Vertical line 201D is floating. Therefore, a high signal provided to node I traverses the plurality of location transistors 401 in an alternate path 602B (and original path 601). Resistor R is still in alternate path 602B and therefore the output signal at node O is a logic zero. Because the resistances of paths 601 and 602B are substantially equal, alternate path 602B does not localize resistor R.

In FIG. 6D, location transistors 401B–401C have their gates coupled to Vcc, thereby turning on those transistors. Location transistors 401A, 401D, and 401E have their gates coupled to ground, thereby turning off those transistors. Vertical line 201D is floating. Therefore, a high signal provided to node I traverses the plurality of location transistors 401 in an alternate path 602C (and original path 601). Resistor R is still in alternate path 602C and therefore the output signal at node O is a logic zero. Because the resistances of paths 601 and 602C are substantially equal, alternate path 602C does not localize resistor R.

In FIG. 6E, location transistors 401A–401B have their gates coupled to Vcc, thereby turning on those transistors. Location transistors 401C, 401D, and 401E have their gates coupled to ground, thereby turning off those transistors. Vertical line 201D is floating. Therefore, a high signal provided to node I traverses the plurality of location transistors 401 in an alternate path 602D (and original path 601). Resistor R is not in alternate path 602D and therefore the output signal at node O is a logic one (the input signal taking the path of least resistance through alternate path 602D). Because the resistances of paths 601 and 602D are different, alternate path 502D localizes resistor R. Specifically, the present invention identifies the segment of line 201C between transistors 401A and 401B as having resistor R.

Note that adjacent, parallel lines in test structure 200 are not limited to similar process features. For example, line 201D can be a metal 1 line whereas line 201C can be a series of metal 1 vias. Moreover, in another embodiment of the invention, parallel, non-adjacent lines are used in the test structure. In yet another embodiment, these non-adjacent lines are provided in different layers. This flexibility can be advantageous in situations where one type of process feature has significantly more defects than another type of process feature. In this situation, a line comprising process features with no substantive defects can be used as the standard against which other lines are compared. In FIGS. 5A–5E and 6A–6E, line 201D is the standard (i.e. no defect line) against which line 201C is compared.

Figure 7:
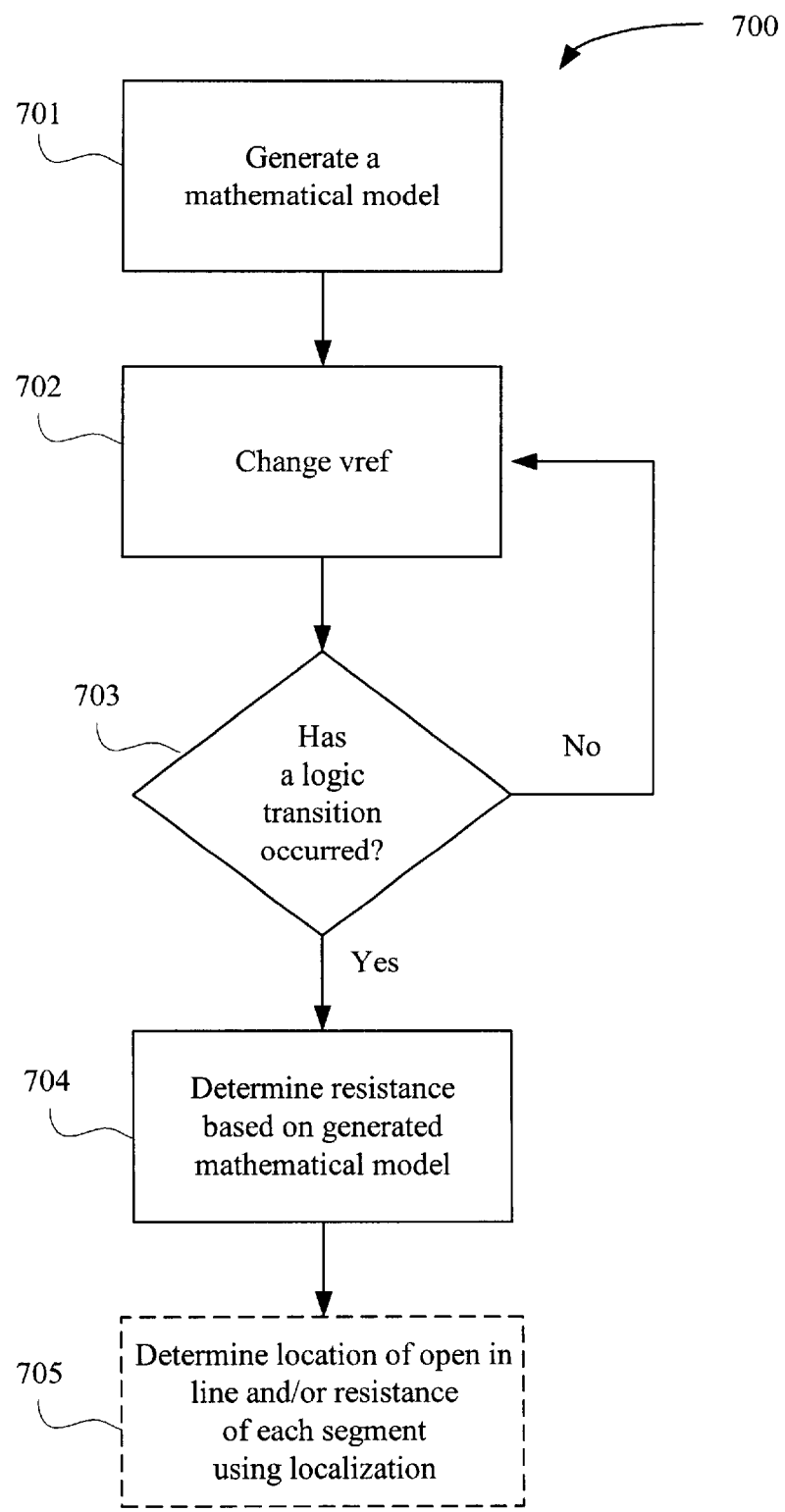
FIG. 7 illustrates a flow chart of the test method of the present invention.

FIG. 7 illustrates a flowchart 700 that summarizes one embodiment of the method of the present invention. In step 701, a mathematical model is generated of the sense amplifier and the line resistance. In step 702, reference voltage vref is changed (i.e., increased or decreased). If a logic transition does not occur in the sense amplifier, as determined in step 703, then the process loops back to step 702 in which the reference voltage Vref is changed again. On the other hand, if a logic transition does occur, then in step 704 the resistance of the line is determined based on the generated mathematical model. If desired, in step 705 the location of an open (or multiple opens) in a line and the resistance of each segment of the line can be determined using localization circuitry. Note that if the user desires to detect shorts (not opens), as described in detail below, then step 705 is not used.

Figure 8:
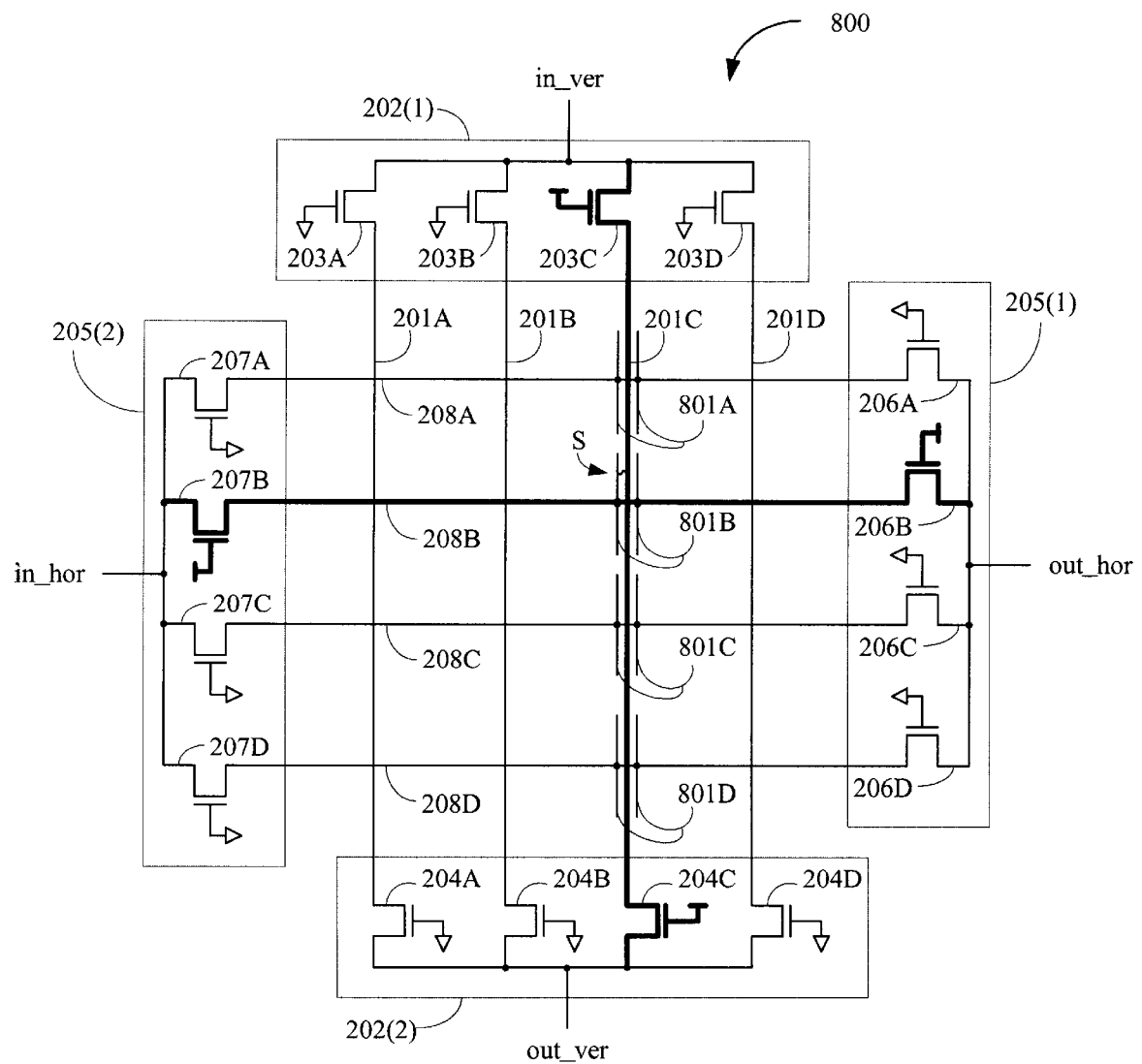
FIG. 8 illustrates a test structure for locating shorts in an integrated circuit.

The test structure of the present invention works equally well to detect shorts. FIG. 8 illustrates a test structure 800 substantially similar to test structure 200 (FIG. 2A) and further including a plurality of test strips 801. In a preferred embodiment, each section of the test line has a pair of test strips provided in parallel orientation on either side of the tested line. For example, in FIG. 8, four pair of test strips 801A–801D roughly define four sections of vertical line 201C (the tested line). Test strips 801 are formed from the same layer as vertical lines 201. Each test strip 801 is connected (using a via or a contact) to a line perpendicular to the tested line in test structure 800, i.e. a horizontal line 208. As described previously, horizontal lines 208 are formed from a different layer than vertical lines 201. Therefore, to detect shorts, the device is made with connections between multiple layers of the integrated circuit.

In this embodiment, test strips 801A are connected to horizontal line 208A, test strips 801B are connected to horizontal line 208B, test strips 801C are connected to horizontal line 208C, and test strips 801D are connected to horizontal line 208D. Other test strips associated with other lines (both vertical and horizontal) are omitted for clarity. The length of a test strip 801 may be dependent on the length of the tested line. For example, in one conservative embodiment, test strips 801, if joined end to end, are substantially the length of the tested line.

In the configuration shown in FIG. 8, to detect a short S existing between vertical line 201C and an adjacent test strip 801, a logic one signal is first provided to vertical line 201C via terminals in_ver and out_ver. Then, each horizontal line 208 is selected in turn (i.e., the appropriate decoder transistors 206 and 207 are turned on/off). The selected horizontal line 208 is connected to two sense amplifiers (not shown in FIG. 8) via terminals in_hor and out_hor. Therefore, if a short exists, then the logic one signal on vertical line 201C will also be provided on the test strip having the short as well as the horizontal line 208 connected to that test strip. Thus, the sense amplifiers will output a logic one signal when the horizontal line 208 associated with the short is selected.

Note that in another embodiment of the invention, the logic one signal may be provided to only one terminal, such as terminal in_ver. However, providing the logic one signal to both terminals in_ver and out_ver ensures that a short can be detected even if the vertical line 201 in question has a single open. Similarly, in another embodiment, only one sense amplifier is coupled to the selected horizontal line 208. However, providing a sense amplifier at both terminals in_hor and out_hor allows detection of the short even if the selected line 208 has a single open.

By identifying the horizontal test line(s) 208 that carries the logic one signal, the user can determine the location of the short(s) on vertical test line 201C (i.e., the section of the line). Clearly, identifying the location of the short will also identify the layer (in FIG. 8, the layer associated with vertical line 201C).

Figure 9:
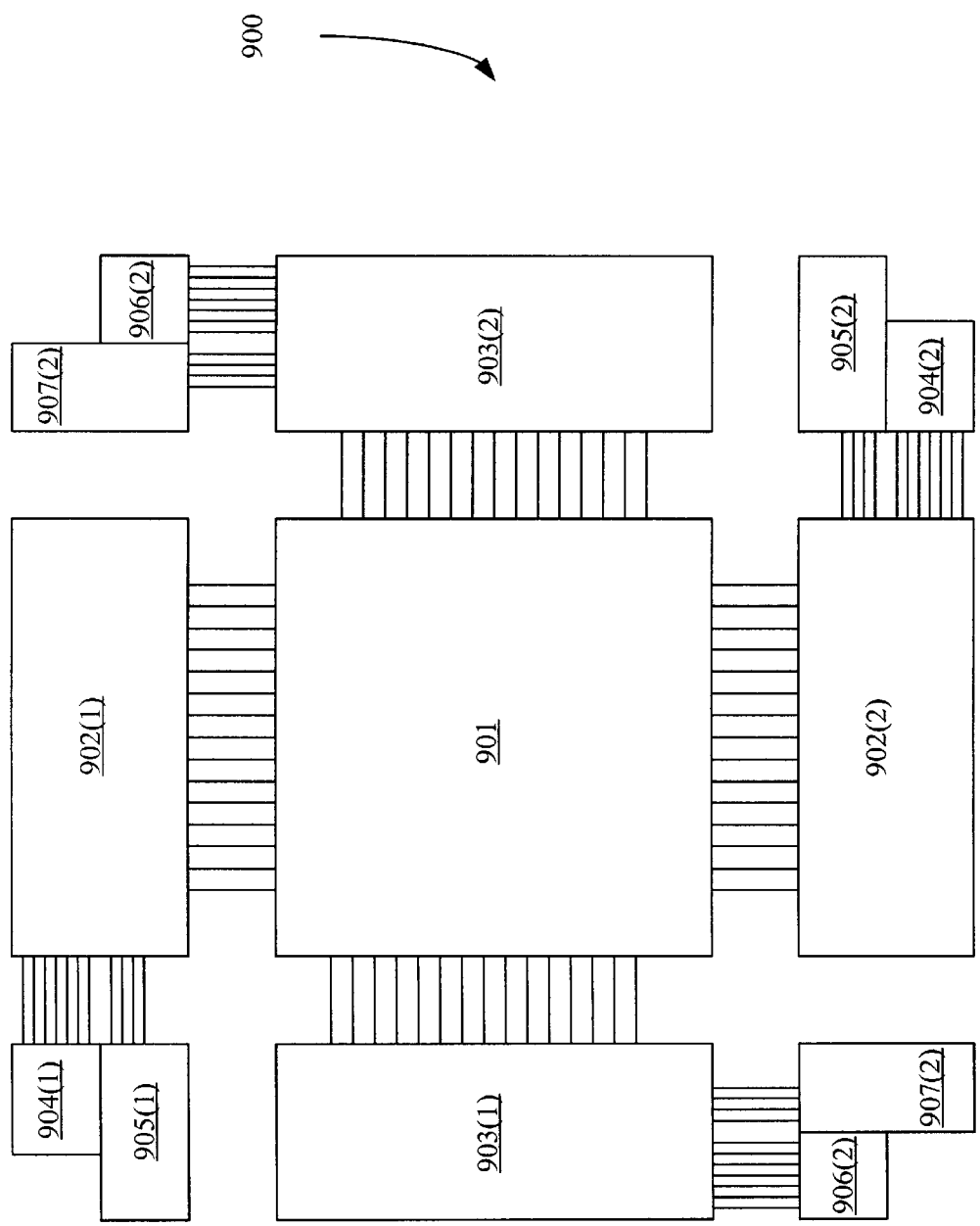
FIG. 9 illustrates one layout of the test structure of the present invention.

FIG. 9 illustrates one layout 900 including a test structure 901 in accordance with the present invention, vertical decoders 902(1) and 902(2), and horizontal decoders 903(1) and 903(2). Each decoder 902 has an associated predecoder 904 and control logic 905. In a similar manner, each decoder 903 has an associated predecoder 906 and control logic 907. The control circuitry includes the sense amplifier, pass gates, drivers, and associated transistors (described in reference to FIG. 2B, for example) to create the appropriate path to test selected lines in test structure 901. The decoders and predecoders are standard N-to-1 decoding structures known by those skilled in the art and therefore not described in detail herein.

Figure 10A:
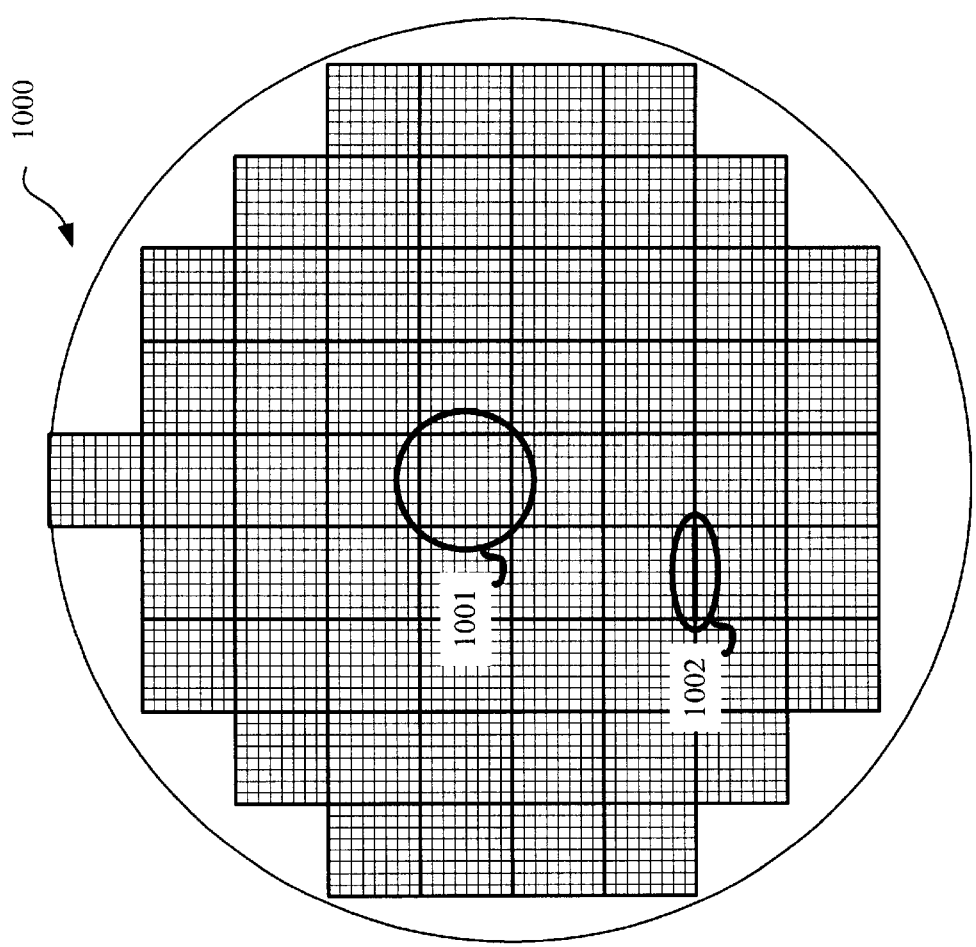
FIGS. 10A–10C illustrates wafers including a plurality of integrated circuits and various test structures in accordance with the present invention.

In one embodiment, the test structure of the present invention is placed on a production wafer between two integrated circuits and is spliced off after the wafer is manufactured. FIG. 10A illustrates an illustrative wafer 1000 including a plurality of integrated circuits (i.e. chips) 1001, wherein one or more scribe lines 1002 include the test structure of the present invention.

Figure 10B:
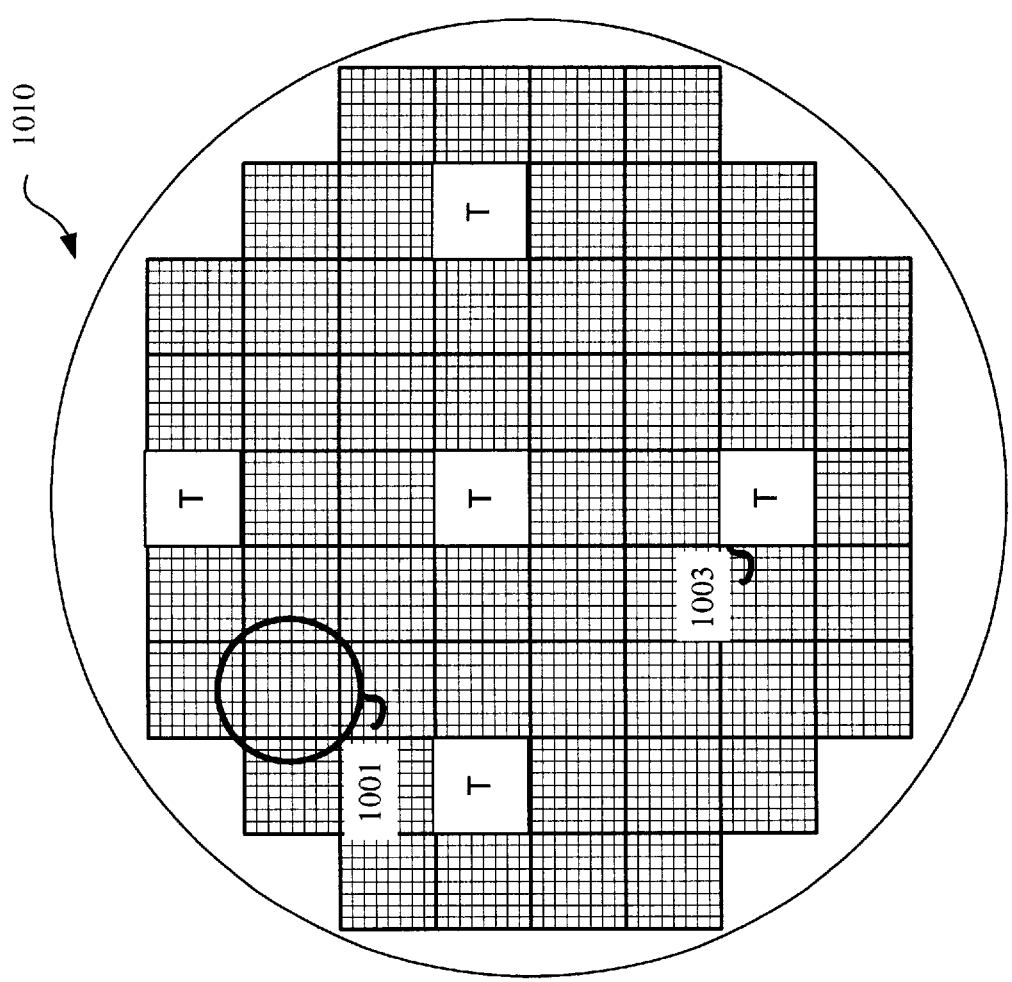

If the user determines that more area is required for test structures to increase the probability of detecting defects, then product can be replaced by chips including larger test structures. FIG. 10B illustrates one such embodiment wherein wafer 1010 includes a plurality of integrated circuits 1001 (product) and a plurality of test chips 1003 dedicated to test systems. In this embodiment, the test structure may be formed using standard design rules for a production chip. Note that the number of chips 1003 and their position can vary between wafers or wafer lots. Thus, for example, a prototype wafer may have more test chips 1003 than a production wafer.

Figure 10C:
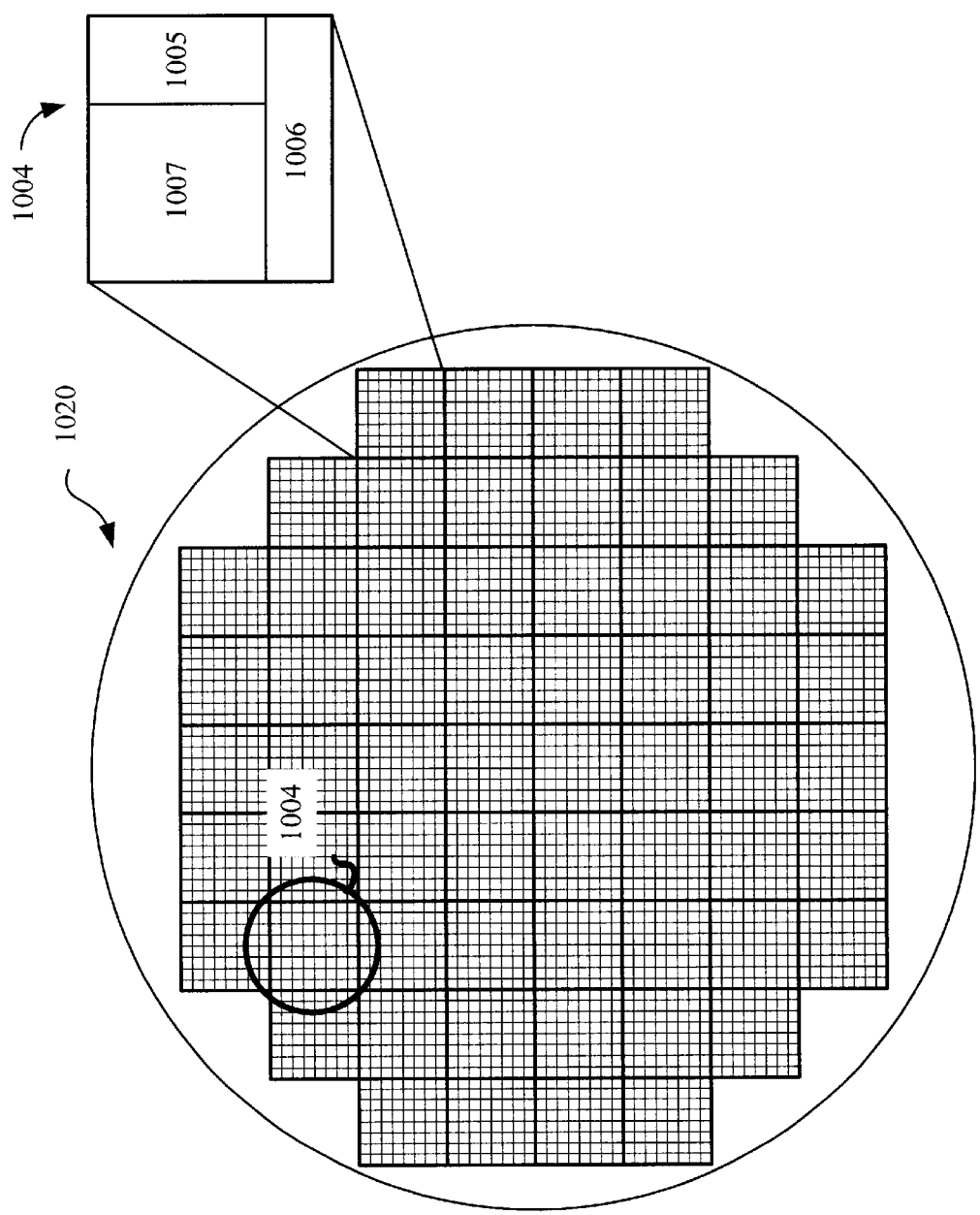

In yet another embodiment, shown in FIG. 10C, each integrated circuit 1004 includes a product portion 1007 (such as a programmable logic device), a test system 1005 in accordance with the present invention, and other test structures 1006. In this embodiment, once the yield reaches an acceptable level, the fab can selectively shutter out structures 1005 and 1006, as desired. Alternatively, the fab can replace the reticles for wafer 1020 with reticles that have integrated circuits comprising product only.

The present invention has significant advantages over the prior art. Specifically, defect levels down to a few parts-per-million can be detected quickly at minimal expense. Moreover, the location of those defects can be determined within a few micrometers. Because of the unique test structure provided, separate feedback can be provided for each process layer. Finally, resistances can be ordered (from highest to lowest in one embodiment) in a report to the user, thereby ensuring that problems can be quickly analyzed and corrected.

As another advantage, the present invention allows the user to better use failure analysis. For example, if the resistances are substantially distributed across the tested line, then failure analysis will be tedious, time-consuming, and generally non-conclusive. However, if one segment of the tested line has a significantly higher resistance than other segments, then failure analysis can be done quickly and yields much better conclusions. Thus, the present invention facilitates better failure analysis.

The specific embodiments of the present invention are presented for purposes of description and illustration only. These embodiments are not intended to be exhaustive or to limit the invention in any way. Those skilled in the art will recognize modifications and variations to the present invention. For example, referring to FIG. 2B, instead of transistor 218 being coupled to ground (thereby providing a weak pull-down), transistor 218 is coupled to a positive voltage source Vcc (thereby providing a weak pull-up). In this embodiment, a low test_in signal is provided. As another example and referring to FIG. 4, adjacent parallel lines in the test structure may even be formed from different layers in the integrated circuit. Thus, the present invention is only defined by the appended claims.

What is claimed is:

1. A method to analyze an open in a line of an integrated circuit, the method comprising:
   coupling a sense amplifier to the line;
   providing a predetermined input signal to the line;
   providing a plurality of reference voltages to the sense amplifier, wherein a reference voltage controls a sensitivity of the sense amplifier; and
   determining output signals of the sense amplifier based on the plurality of reference voltages.

2. The method of claim 1, further including generating a mathematical model of a resistance of the line based on the reference voltage provided to the sense amplifier.

3. The method of claim 2, wherein the mathematical model is generated using a simulation program.

4. The method of claim 3, wherein an output of the simulation program is examined using a graphical analysis program.

5. The method of claim 2, further including traversing the line in a first path, the first path comprising predetermined sections of the line.

6. The method of claim 5, further including traversing the line in a second path, the second path comprising other predetermined sections of the line.

7. The method of claim 6, further including comparing a resistance associated with the first path and a resistance associated with the second path.

8. The method of claim 7, wherein comparing determines a resistance of the open.

9. The method of claim 2, further including traversing predetermined sections of the line without traversing at least one other predetermined section of the line.

10. A test system for identifying defects in an integrated circuit, the test system comprising:
    a sense amplifier;
    a first line;
    a second line;
    a decoder coupled to the amplifier, the first line, and the second line; and
    a plurality of transistors, each transistor having a source, a drain, and a gate, the source and the drain respectively connected to the first line and the second line, and the gate coupled to selection circuitry.

11. The test system of claim 10 further including:
    a plurality of pairs of test strips provided in parallel orientation on either side of the first line; and
    a third line positioned in perpendicular orientation to the first line and the second line, wherein at least one test strip is coupled to the third line.

12. The test system of claim 10, wherein the first line and the second line are formed from the same process features in the integrated circuit.

13. The test system of claim 11, wherein the first line and the second line are formed from different process features in the integrated circuit.

14. The test system of claim 10, wherein the test system is provided on a production wafer.

15. The test system of claim 10, wherein the test system is provided on a test chip.

16. The test system of claim 10, wherein the selection circuitry forms part of the decoder.

17. A test system for identifying defects in an integrated circuit, the test system comprising:
- a first inverter;
- a first line;
- a second line;
- a decoder coupled to the first inverter, the first line, and the second line; and
- a plurality of transistors, each transistor having a source, a drain, and a gate, the source and the drain respectively connected to the first line and the second line, and the gate coupled to selection circuitry.

18. The test system of claim 17 further including a second inverter having a trigger point different than the first inverter, wherein the decoder is selectively coupled to the second inverter.

19. A method of determining segment resistance comprising:

forming an alternate path based on a segment;

measuring the resistance when the alternate path is included; and calculating the resistance of the segment.

20. A method of localizing a high resistance line portion comprising:

testing a line, wherein if the line is found to have a high resistance, then;

testing an adjacent line; and forming alternative paths through a combination of the high resistance line and the adjacent line until a high resistance portion is isolated.

* * * * *